United States Patent
Meschter et al.

[11] Patent Number: 5,999,407
[45] Date of Patent: Dec. 7, 1999

[54] ELECTRONIC MODULE WITH CONDUCTIVELY HEAT-SUNK COMPONENTS

[75] Inventors: Stephan John Meschter, Endicott; Gary Miller, Vestal; Mark Richard Burdick, Endwell; Joseph Edward Kane, Johnson City, all of N.Y.

[73] Assignee: Lockheed Martin Corp., Johnson City, N.Y.

[21] Appl. No.: 09/177,010

[22] Filed: Oct. 22, 1998

[51] Int. Cl.$^6$ ...................................................... H05K 7/20
[52] U.S. Cl. .......................... 361/704; 165/80.2; 165/185; 174/16.3; 361/715; 361/719
[58] Field of Search ................................ 165/80.2, 80.3, 165/185; 174/16.3; 257/706–707, 712–713, 718, 719; 361/690, 699, 688, 704, 707, 709–711, 715, 719–720, 737, 752, 831

[56] References Cited

U.S. PATENT DOCUMENTS

| | | | |
|---|---|---|---|
| 4,621,304 | 11/1986 | Oogaki et al. | 361/704 |
| 4,942,497 | 7/1990 | Mine et al. | 361/699 |
| 4,962,444 | 10/1990 | Niggemann | 361/699 |
| 5,396,401 | 3/1995 | Nemoz | 361/690 |
| 5,414,592 | 5/1995 | Stout et al. | 361/704 |
| 5,887,435 | 3/1999 | Morton | 361/688 |

*Primary Examiner*—Gregory Thompson
*Attorney, Agent, or Firm*—W. H. Meise; G. H. Krauss

[57] ABSTRACT

A heat transfer arrangement for one or more heat-generating components (18a) on a printed-circuit board (16) includes a heat transfer plate (316) defining an aperture (416) registered with the components. A "vertically" movable heatsink adapter (410) is adjusted to juxtapose its "lower" surface with the "upper" surface of the components to be heat-sunk. A heat-transfer pad (318) may be used between the heatsink adapter (410) and the component (18a). In various embodiments, the heatsink adapter takes the form of circular (410) or rectangular (410R) plugs, a draw-tube (808) arrangement, or a bellows (1010).

9 Claims, 10 Drawing Sheets

ELECTRONIC MODULE WITH CONDUCTIVELY HEAT-SUNK COMPONENTS

FIELD OF THE INVENTION

This invention relates to heat transfer arrangements for electronic assemblies or modules.

BACKGROUND OF THE INVENTION

Semiconductor devices rely for the most part on the properties of germanium, silicon, and gallium arsenide materials. These materials are subject to significant molecular diffusion at temperatures as low as 100° C. Such diffusion tends to adversely affect the integrity of the microscopic patterns required for proper operation of the semiconductor device. Such semiconductor devices are minuscule and delicate, and must be protected against the environment by a device carrier such as a metal can, or a plastic or ceramic encapsulant. The device carrier acts as a barrier which tends to impede heat transfer away from the semiconductor device. As the complexity and speed of semiconductor devices has increased, the internal heat generated by such semiconductor devices has tended to increase. In many applications, simple "heat sinks" which transfer heat from the semiconductor device carrier to the ambient air may be sufficient to maintain the temperature of the semiconductor device at a level providing satisfactory performance and reliability. In some applications such as personal computers, recent microprocessors generate sufficient heat that an integral heat-sink/air-circulating fan is required for reliable performance. In some applications, however, which include industrial and military applications, the ambient air temperature may be high enough so that sufficient heat cannot be effectively transferred from the device carrier by convection alone, and/or fan reliability itself is not high enough. Also, the air may be contaminated in which case it cannot be allowed to come into contact with the electronic interconnections. In those cases, direct conduction of the heat to a remote heat sink may be required.

In FIG. 1, an electronic assembly 10 includes a peripheral, thermally conductive frame 12. Frame 12 defines an enclosed space 14, which is occupied, at least in part, by a printed circuit board or printed wiring board 16, the upper surface 16u of which is visible. A plurality of electrical or electronic components, some of which are designated as 18a and 18b, are mounted on the upper or component side 16u of board 16. The frame 12 of the assembly 10 defines a pair of flanges 22, only one of which is visible, which allow the assembly to be easily slid into position in a rack (not illustrated) or other holder. A set of "card locks" 26 extends along at least a portion of the upper surfaces of flanges 22 to provide clamp pressure for tending to hold the flanges in position in the rack. A "mezzanine" printed-circuit board 20 is mounted above some of the components 16. A pair of electrical connectors 24a, 24b provide electrical interconnection between the printed circuit boards 16 and 20 and related external electronic circuitry (functions). The assembly 10 also may include covers (not illustrated), which protect the printed-circuit boards and the components. The presence of the mezzanine board makes space in the assembly critical.

FIG. 2 is a cross-section of a portion of the assembly of FIG. 1 near the frame, showing how the flanges connect to the surrounding rack or frame, and illustrating heat conduction paths. In FIG. 2, the rack is illustrated in cross-section as 210, and includes bosses or protuberances 210p1 and 210p2, which provide support for the illustrated edge of the module or assembly 10. As illustrated, flange 22 has a lower surface lying against a surface of boss 210p2, and card lock 26 extends between the upper surface of flange 22 and the lower surface of upper boss 210p1. In this context, the terms "upper" and "lower" refer to position as referred to the FIGURE, and do not necessarily relate to the position of the actual mounted assembly 10.

In FIG. 2, component or device 18a is electrically and mechanically connected to the upper surface 16u of printed circuit board 16 by electrically conductive wires or leads 19. The lower surface 16l of printed circuit board 16 is visible in FIG. 2. There will always be some space or gap 209, however small, between the lower surface of component 18a and the upper surface 16u of printed circuit board 16. The gap dimension is exaggerated in FIG. 2 for clarity. During operation of the component 18a, heat is necessarily generated. If the heat were allowed to accumulate, the temperature of the component would rise continuously, until it was destroyed. Heat may be removed or transferred away from the component by radiation, convection, or conduction, as known. In the illustrated context, heat removal by radiation and convection may not be sufficient to maintain the component at a temperature within its reliable operating range. Additional heat transfer is provided by thermal conduction through gap 209 between component 18a and the upper surface of printed circuit board 16u, as illustrated by dashed arrow 220. The heat entering the upper surface of printed circuit board 16 flows laterally, as indicated by dash arrow 222, and through the joint between the upper surface 16u of printed wiring board 16 and frame 12, as indicated by dash arrow 224. Within frame 12, the heat which enters from printed circuit board 16 flows by a short path through the interface with lower boss 210p2 of rack 210. Rack 210 is deemed to be a heat sink, meaning that it is large enough, or has sufficient surfaces for loss of heat, so that it remains at a relatively constant or low temperature. Those skilled in the art know that the printed circuit board 16 is not a good conductor of heat, and gap 209 tends to impede heat transfer, and that, as a consequence, the temperature rise of components such as 18a may still exceed that desired.

FIG. 3 is a simplified cross-section of another arrangement, similar to that of FIG. 2, but which provides superior conductive heat transfer. Elements of FIG. 3 which correspond to those of FIG. 2 are designated by like reference numerals. FIG. 3 differs from FIG. 2 in that it includes an upper or top heat transfer plate 316, which is supported by frame 12, and fastened thereto by a set of screws, one of which is illustrated as 330. An efficient thermally conductive heat transfer device or pad 318 is located between the upper surface of component 18a and the lower surface 316l, to improve the thermal conduction of what would otherwise be an air gap of poor thermal conductance. In addition to heat transfer as described in conjunction with FIG. 2, as illustrated by dash arrows 220, 222, 224, and 226, the presence of the heat transfer plate 316 and device 318 provides additional paths including the path between the upper surface of the component 18a and the lower surface 316l of heat transfer plate 316 by way of device 318, which is illustrated by dash arrow 320, a lateral path through heat transfer plate 316, as illustrated by dash arrow 322, and a further path through the juncture between heat transfer plate 316 and frame 12, as illustrated by dash arrow 324. All of the heat entering frame 12, and represented by arrows 224 and 324, is conducted to boss 210p2, as suggested by dash arrow 226. The arrangement of FIG. 3 provides superior heat transfer by comparison with the arrangement of FIG. 2, because there are two parallel paths for transfer of heat over much of the path, and because the additional path through heat transfer plate 316 is likely to have greater capacity for thermal conduction than the path through printed circuit board 16.

One problem with the arrangement of FIG. 3 is that the device 318 must fill the gap between the lower surface 316*l* of the heat transfer plate 316 and the upper surface of the component 18*a*. The dimension of this gap cannot be minimized because of tolerance build-ups, and possibly because of the presence of a mezzanine circuit board as illustrated in FIG. 1, or because of other mechanical constraints, as might occur if the components to be heat sunk have different heights above the printed-circuit board. Another problem with the arrangement of FIG. 3 is that the thermal path from the component 18*a* to the lower surface 316*l* of heat transfer plate 316 must be capable of disassembly without damage to component 18*a*, because the heat transfer plate is likely to need removal to repair some other portion of the printed circuit board 16, and it would be too costly and inefficient if all of the heat-sunk components (assuming that there are more heat-sunk components than only 18*a*) were to be damaged by the removal of the heat transfer plate for repair. Consequently, device 318 cannot be bonded to both the upper surface of component 18*a* and to the lower surface 316*l* of heat transfer plate 316. At least one of the thermal/mechanical connections must be readily breakable; this may be either the connection between device 318 and the lower surface 316*l* of top plate 316, or between the lower surface of device 318 and the upper surface of component 18*a*. In order to identify the breakable joint or connection, a heavy dash line 340 is illustrated at the upper surface of component 18*a*. Devices such as 318 tend to be flexible pads of various sorts, which must be somewhat compressed to provide adequate heat transfer, but which cannot be excessively compressed. These pads, in general, do not have thermal properties approximating those of a fusion bond or a metallic connection. In general, the tolerances will not allow the thinnest devices 318 to be used, which are simple interface layers of thermally conductive grease. Such greases, even though they may not have thermal characteristics matching those of metals, are so thin that their heat transfer performance is good.

Improved heat transfer arrangements are desired.

SUMMARY OF THE INVENTION

Thus, an electronic assembly according to an aspect of the invention includes a thermally conductive frame defining an open, generally flat interior volume, with a planar printed wiring board located within the interior volume. The printed wiring board defines first and second surfaces, and is loaded with components adjacent at least the first surface. At least one of the components requires conductive heat sinking. The electronic assembly also includes a heat transfer plate mechanically and thermally coupled to the frame. The heat transfer plate extends generally parallel with the plane of the printed wiring board, and is spaced away from the first surface of the printed wiring board in a manner which leaves a gap between that surface of the heat transfer plate which is nearest the printed wiring board and that one of the components requiring conductive heat sinking. The heat transfer plate defines an aperture registered with the one of the components. A heatsink adapter is thermally coupled to the edges of the aperture, and is mechanically mounted within the aperture in a manner which provides for motion in a direction toward and away from the first surface of the printed wiring board if a permanent bond is not provided. The heatsink adapter is positioned within the aperture in a manner selected for making thermal contact with the one of the components, as a result of which a conductive heat path extends from the one of the components, through the heatsink adapter, through the edges of the aperture into the heat transfer plate, and through the heat transfer plate to the frame.

In a particular avatar of the invention, the aperture is circular, and the heatsink adapter is a thermally conductive plug in the form of a right circular cylinder having a diameter no greater than the diameter of the circular aperture. The heatsink adapter is slideably mounted within the aperture. In this avatar, a version has an internally threaded circular aperture, and the heatsink adapter is externally threaded to match the threads of the circular aperture, whereby the heatsink adapter can be moved by relative rotation, which slides the threads over each other for providing the desired motion toward and away from the printed circuit board. In another avatar, the heatsink adapter includes fusion bonding pads located on at least two sides of the heatsink adapter, for facilitating fusion bonding to either the edges of the aperture, the one of the components, or both.

In a particular manifestation of the invention, the aperture in the heat transfer plate is rectangular, and the heatsink adapter is a thermally conductive rectangular plug with a set of dimensions no larger than the dimensions of the aperture, so that the plug is slideably movable within the aperture, in the absence of a permanent bond, to provide the motion toward and away from the printed-circuit board. In a version of this manifestation, fusion bonding pads are located on at least two sides of the heatsink adapter, for facilitating fusion bonding to the edges of the aperture, to the one of the components, or both.

Another embodiment of the invention is one in which the heatsink adapter includes a drawtube arrangement. The drawtube arrangement has at least two separate parts, which may of course be permanently bonded together and to the adjacent edge of the aperture and or the one of the components requiring heat sinking. A version of this embodiment is one in which at least one of the tubes of the drawtube arrangement is spring-loaded to provide pressure tending to hold heat-transfer surfaces in intimate contact. The drawtubes may of course have circular, rectangular or other cross-sections.

In yet a further hypostasis of the invention, the heatsink adapter includes a bellows. At least peripheral portions of the bellows are at least thermally coupled to the edges of the aperture, and a central portion of the bellows is thermally coupled to the one of the components. As in the other embodiments, one of the peripheral and central portions of the bellows, or both, may be permanently mechanically coupled to the edges of the aperture and the one of the components, respectively. The bellows may also be filled, or partially filled, with a thermally conductive material, such as a liquid or gel, to further enhance the performance of the heatsink adapter.

DESCRIPTION OF THE INVENTION

Figure 3:
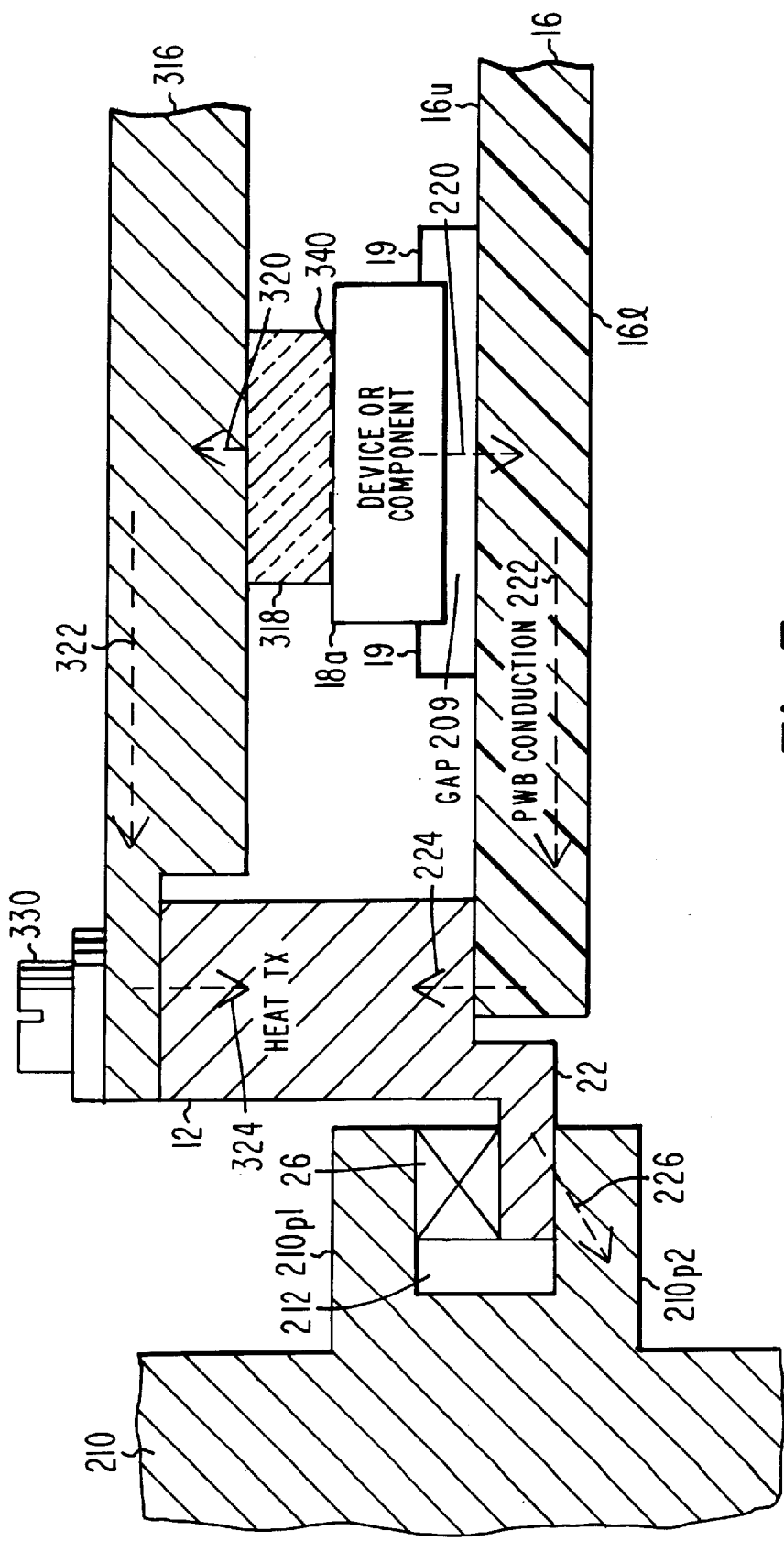
FIG. 3 is a simplified cross-section of another arrangement, similar to that of FIG. 2, but which includes a heat transfer plate that provides superior conductive heat transfer.
Figure 4:
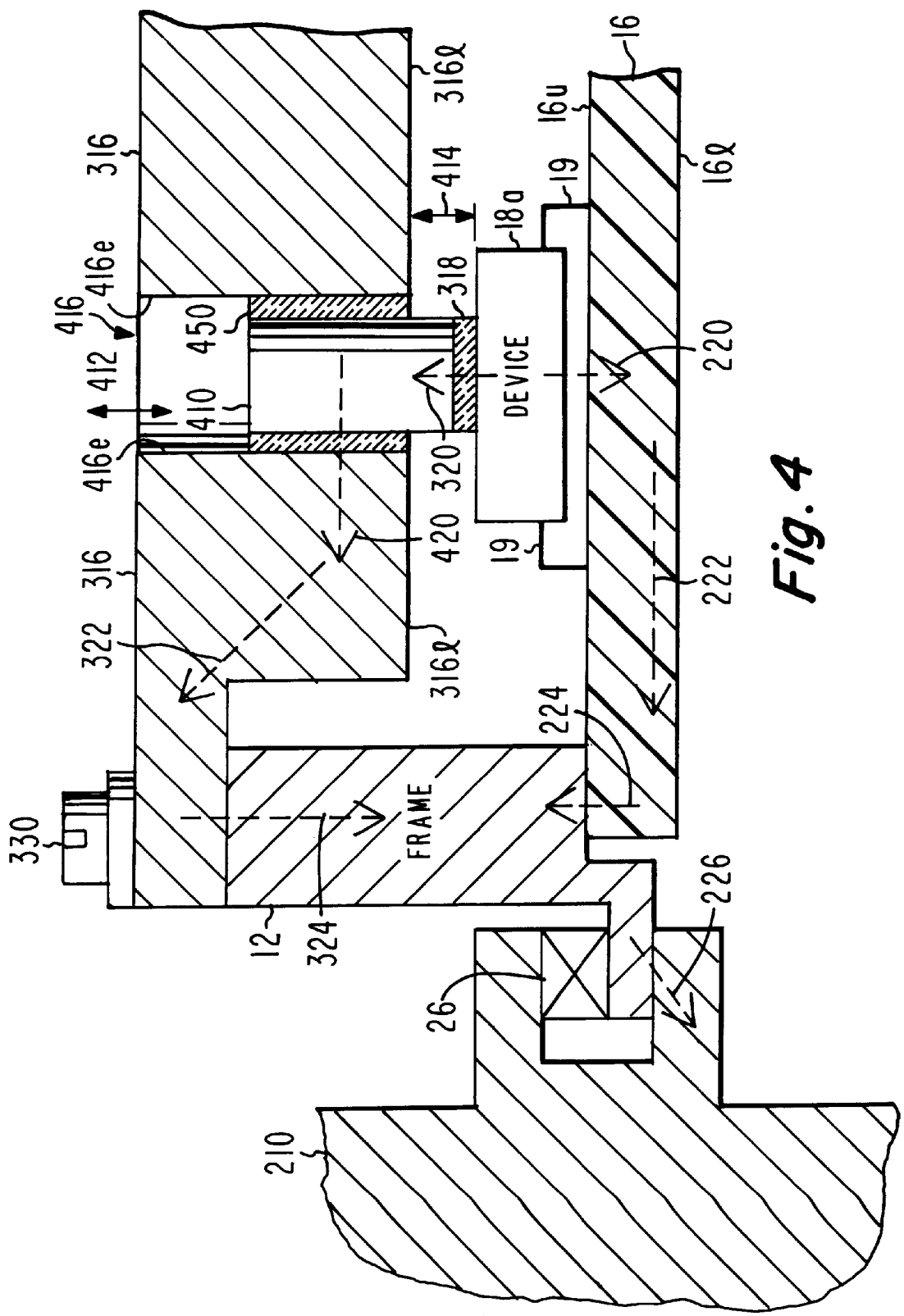
FIG. 4 is a simplified cross-section of an electronic assembly generally like that of FIG. 3, but differing in that a heatsink adapter is used in accordance with an aspect of the invention.
Figure 6:
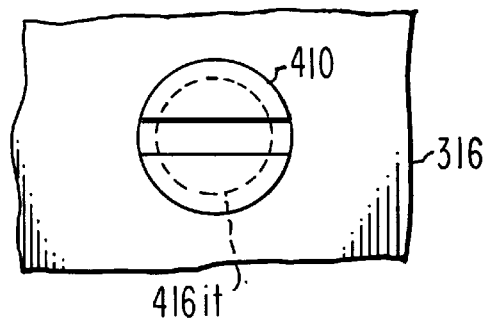
FIG. 6 is a top view of a portion of the heat transfer plate of FIG. 4, with an internally threaded aperture and the heatsink adapter of FIG. 5.
Figure 7:
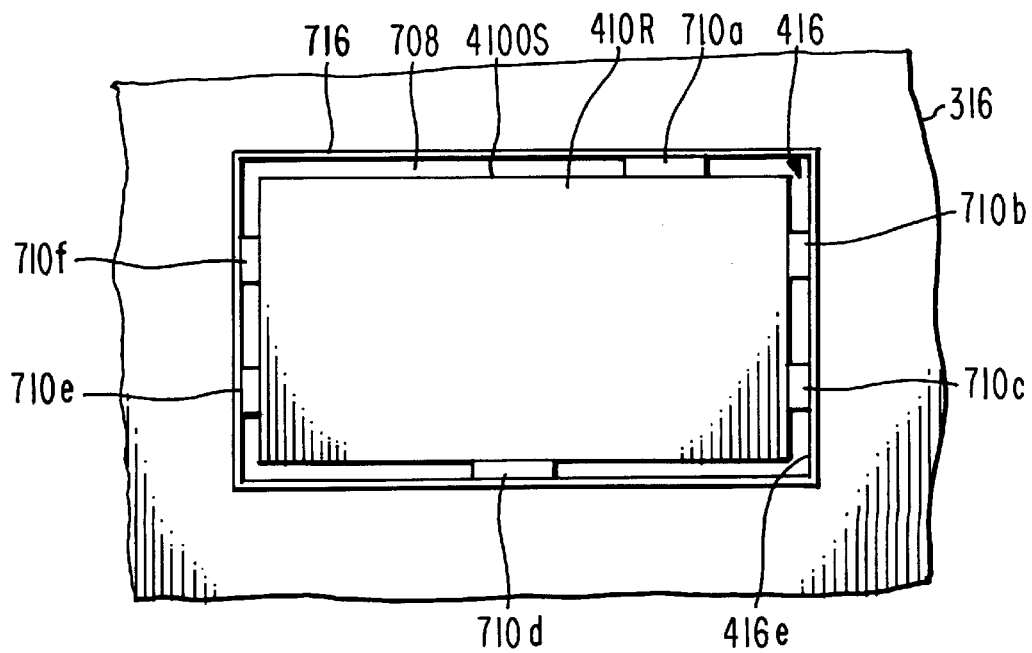
FIG. 7 is a top view of a portion of a heat transfer plate similar to that of FIG. 4, in which the cross-section of the aperture is rectangular, and accommodates a rectangular heatsink adapter.

FIG. 4 is a simplified cross-section of an electronic assembly generally like that of FIG. 3, but differing in that a heatsink adapter 410 is used in accordance with an aspect of the invention. As illustrated in FIG. 4, heat transfer plate 316 is located at a position which results in a gap 414 between the upper surface of device 18a and the lower surface 316l of heat transfer plate 316. Heat transfer plate 316 has an aperture 416 registered with component 18a. Aperture 416 may be circular as illustrated in FIG. 6, or it may be rectangular as illustrated in FIG. 7, or it may have any other shape. The aperture 416 has interior surface or edges 416e. A heatsink adapter 410 has the same cross-sectional shape as aperture 416, and dimensions such that it may be fitted into aperture 416.

If the heatsink adapter 410 has smooth sides as suggested in FIG. 4, and the sides 416e of the aperture 416 are also smooth, a sliding fit between the heatsink adapter 410 and the aperture 416, which provides the possibility of vertical movement in the direction of double-headed arrow 412. The movement, in turn, allows the gap 414 to be precisely bridged by the heatsink adapter 410. If the fit is a tight interference fit, motion may be difficult, if it is too loose a fit, thermal transfer between the walls of the heatsink adapter 410 and the corresponding walls 416e of the aperture 416 may be impeded. The use of thermal grease, illustrated as 450, on the interface should provide good compromise performance.

As illustrated in FIG. 4, a heat transfer device 318 may still be necessary to allow the heat transfer plate, with the heatsink adapter 410, to be removed without damage to the components 18a. It is not needed if the assembly is disposable, and a permanent bond can be made between the component 18a and the heatsink adapter 410, and between the heatsink adapter and the surrounding walls or edges 416e of the aperture 416. However, the presence of a movable heatsink adapter for each component (only one component is illustrated in FIG. 4) on the printed circuit board 16 allows the height of each component to be individually accommodated, thereby minimizing the thickness of device 318 required at each location, possibly to a thin layer of thermally conductive grease. This minimization of the thickness of the path, in turn, tends to maximize the heat flow through the associated thermal interface, which is a very desirable result. In most situations, a junction between the heat transfer plate 316 and the component 18a must be disassemblable without damage to the components, and it is most convenient to place breakable junction immediately adjacent to the component.

Figure 5:
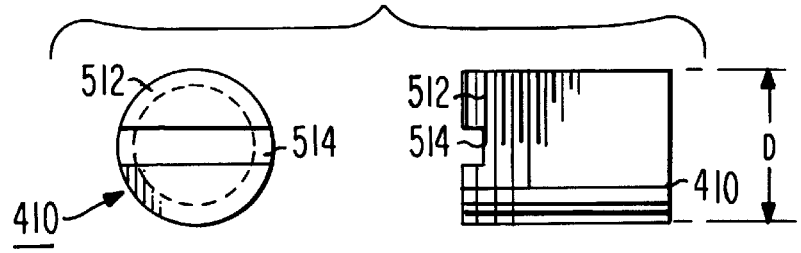
FIG. 5 represents a right circularly cylindrical heatsink adapter similar to that of FIG. 4, which has external threads.

FIG. 5 represents a right circularly cylindrical heatsink adapter 410 which, unlike the one illustrated in FIG. 4, has external threads 512, which match the internal threads 416it of aperture 416 of heat transfer plate 316 of FIG. 6. A slot 514 extending across the upper end of heatsink adapter 410 of FIGS. 5 and 6 allows a screwdriver to grip the adapter for rotation, by which the heatsink adapter 410 can be lowered into contact with the associated component 18a. While the internal and external threads are normally matched, in practice the external thread pitch diameter is reduced slightly to allow for some correction of rotational misalignment. This allows effective heat transfer even if the device is tilted.

Figure 1:
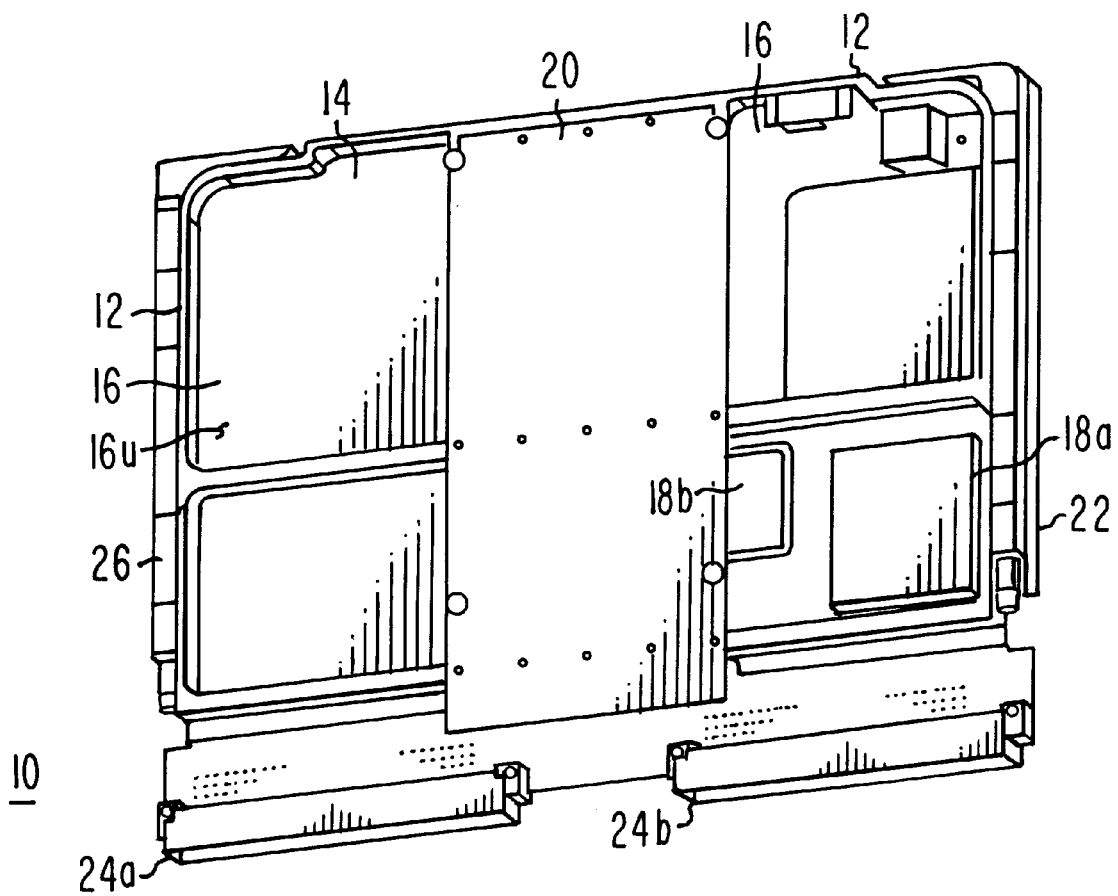
FIG. 1 is a simplified perspective or isometric illustration of a representative electronic assembly or module which includes a frame and a printed wiring board.
Figure 2:
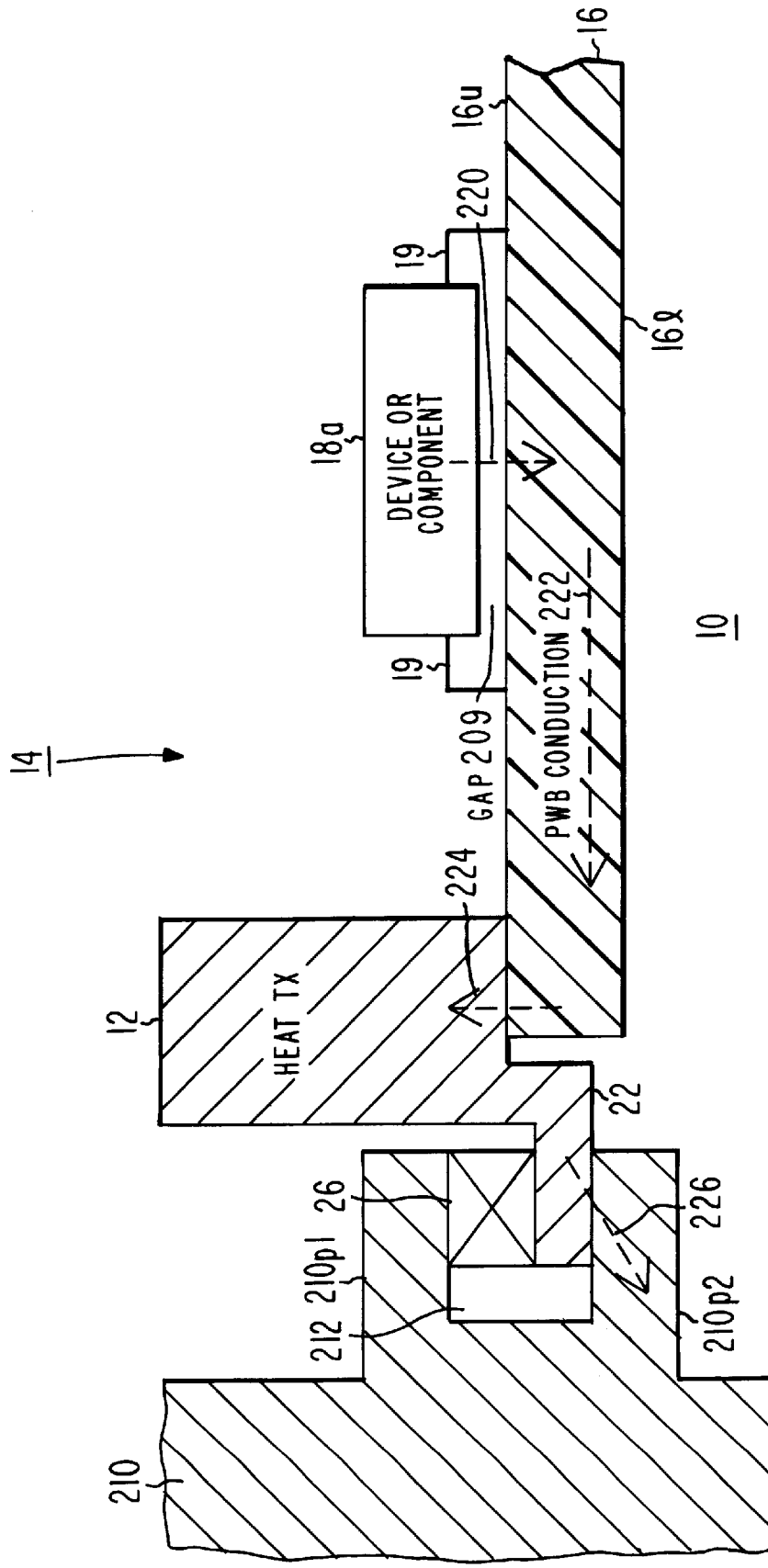
FIG. 2 is a simplified cross-section of a portion of the assembly of FIG. 1 near the frame, showing how the flanges connect to the surrounding rack or frame, and illustrating heat conduction paths.

FIG. 7 is a top view of a portion of a heat transfer plate 316 similar to that of FIG. 4, in which the cross-section of the aperture 416 is rectangular. A thin layer 716 of metallization is provided on the interior walls 416e of the aperture. The heatsink adapter 410R is rectangular, and is dimensioned to fit within the aperture 416. The gap dimension 708 between the aperture walls 416e and the outer surface 410OS of the heatsink adapter 410R is exaggerated for ease of understanding. As illustrated, a plurality of metallized tabs, or pads 710a, 710b, 710c, 710d, 710e, and 710f are deposited or applied to the exterior surface 410OS of the heatsink adapter 410R, which reduce the effective magnitude of the gap 708. The metallized tabs 710a, 710b, 710c, 710d, 710e, and 710f, in conjunction with the metallization 716 of the interior surfaces 416e of the aperture 416 makes it easy to make a fusion bond, as by soldering or brazing. The tabs are located on at least two of the surfaces of the heatsink adapter. Such rectangular heatsink adapters are especially suitable for electronic components, such as microprocessors, which have both substantial heat generation together with a flat, rectangular body, much like components 18a and 18b of FIG. 1.

Figure 8:
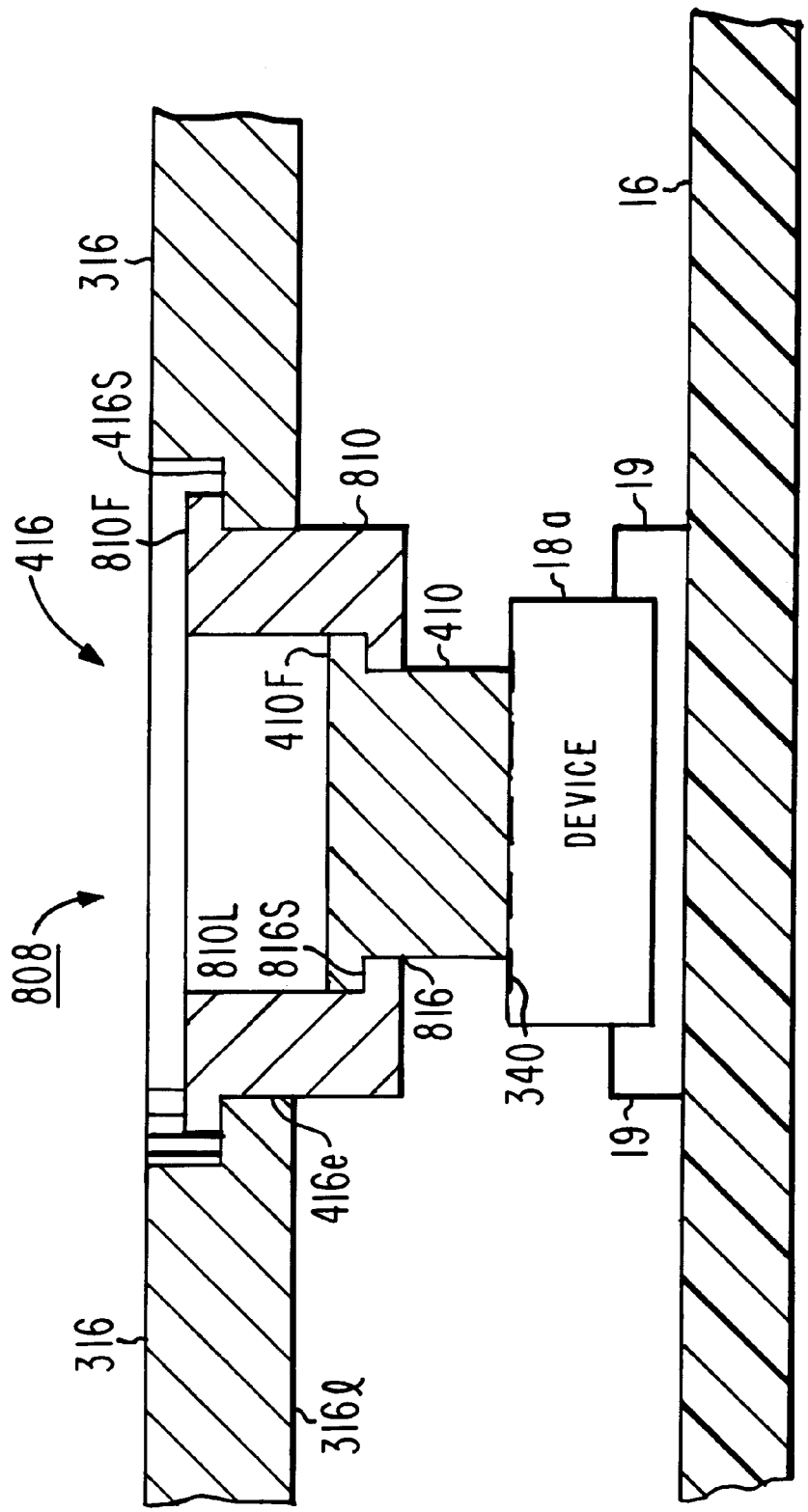
FIG. 8 is a simplified cross-sectional view of a structure similar to that of FIG. 4, but in which the heatsink adapter is in the form of, or includes, a draw-tube.
Figure 9:
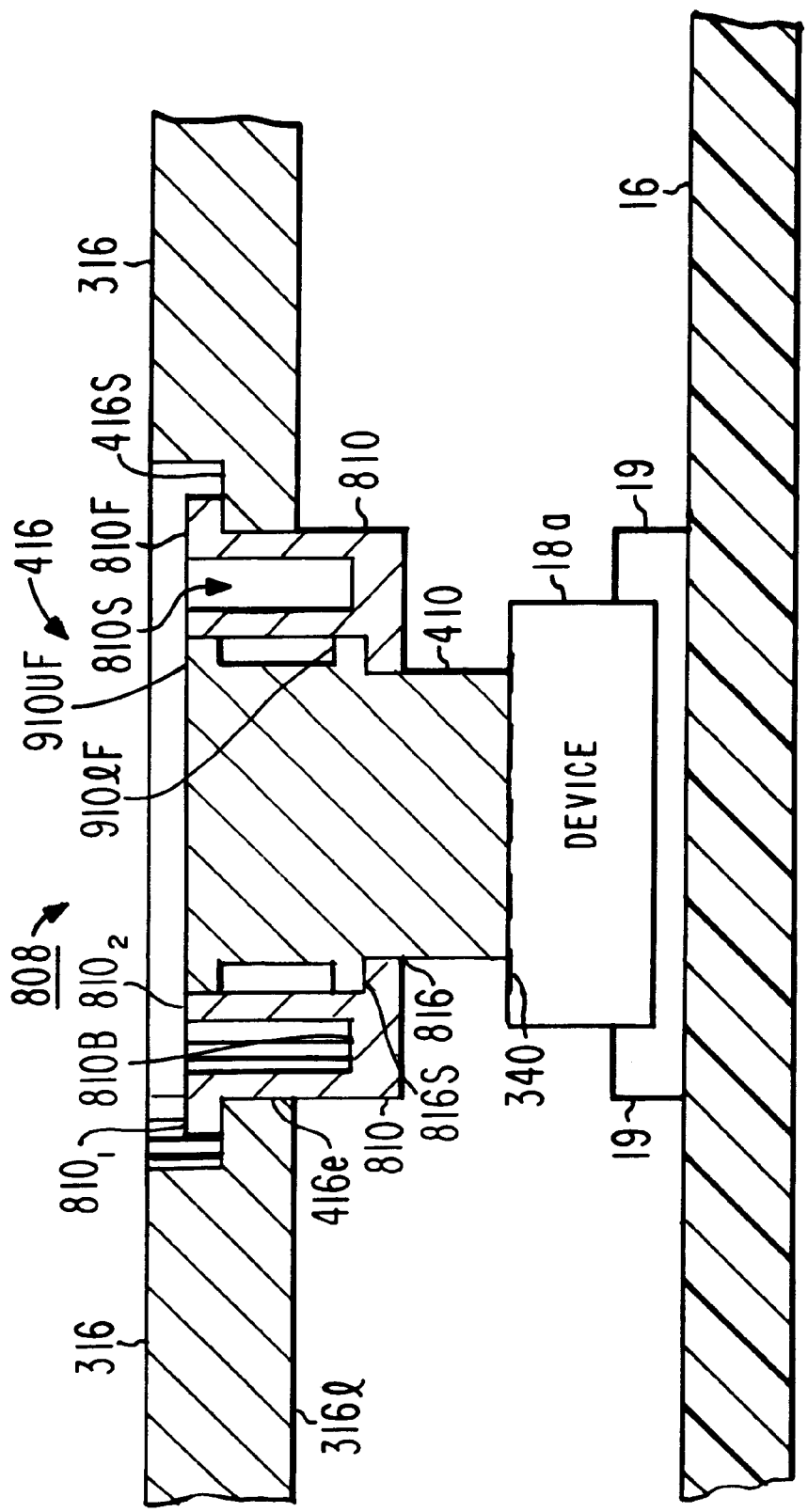
FIG. 9 is similar to FIG. 8, and the wall(s) of the drawtube are split in a manner which results in improved heat transfer.

FIG. 8 is a simplified cross-sectional view of a structure similar to that of FIG. 4, but in which the heatsink adapter is in the form of, or includes, an extensible draw-tube. Elements of FIG. 8 corresponding to those of FIG. 4 are designated by like reference numbers. In FIG. 8, aperture 416 in heat transfer plate 316 has a step 416s. A drawtube arrangement 808 includes an outer flanged tube 810 which slides vertically within aperture 416. The flange 810F of tube 810 coacts with aperture step 416S as a stop, preventing the tube from falling out of the aperture 416 in heat transfer plate 316. The lumen 810L of tube 810 includes a step 816S, which coacts with a flange 410F on heatsink adapter 410 to prevent the heatsink adapter 410 from falling out of the tube 810. The drawtube arrangement 808 allows the tube 810 to slip or slide within aperture 416, and also allows heatsink adapter 410 to slide within lumen 810L, and thereby provides the possibility of a larger range of vertical adjustment for a given height of the constituent elements 410 and 810 than would be possible for either one alone. As illustrated in FIG. 9, the wall of tube 810 may define a slot 810S, which divides the wall of tube 810 into an outer portion 810₁ and an inner portion 810₂, connected along a base region 810$_B$, in a manner reminiscent of a tuning fork. The slot 810S coacts with a lower flange 910/F and an upper flange 910UF to produce pressure on the interior surface of lumen 810L of tube 810, and therefore on inner wall 810₂. The pressure tends to be transmitted across the narrow base region 810$_B$ to the outer wall portion, where the pressure is manifested as a pressure tending to hold the outer surface of outer wall 810$_L$ against the edge 416e of the aperture 416 in heat transfer plate 316. This pressure, in turn, improves the heat transfer across the junction between the drawtube 810 and the heat transfer plate 316.

Figure 10A:
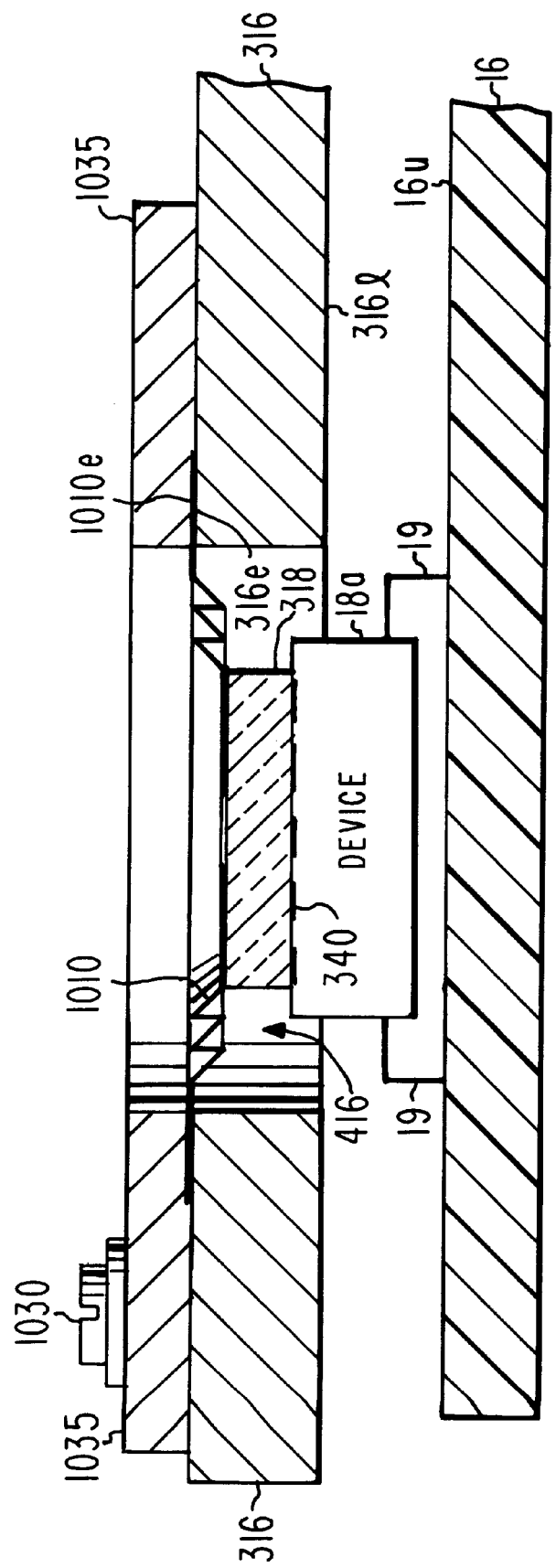
FIG. 10a is a simplified cross-sectional illustration of an arrangement according to an aspect of the invention, in which a heat conducting bellows is mounted near the top of the aperture for making contact with the component, and allows axial movement of the bellows toward and away from the component.
Figure 10B:
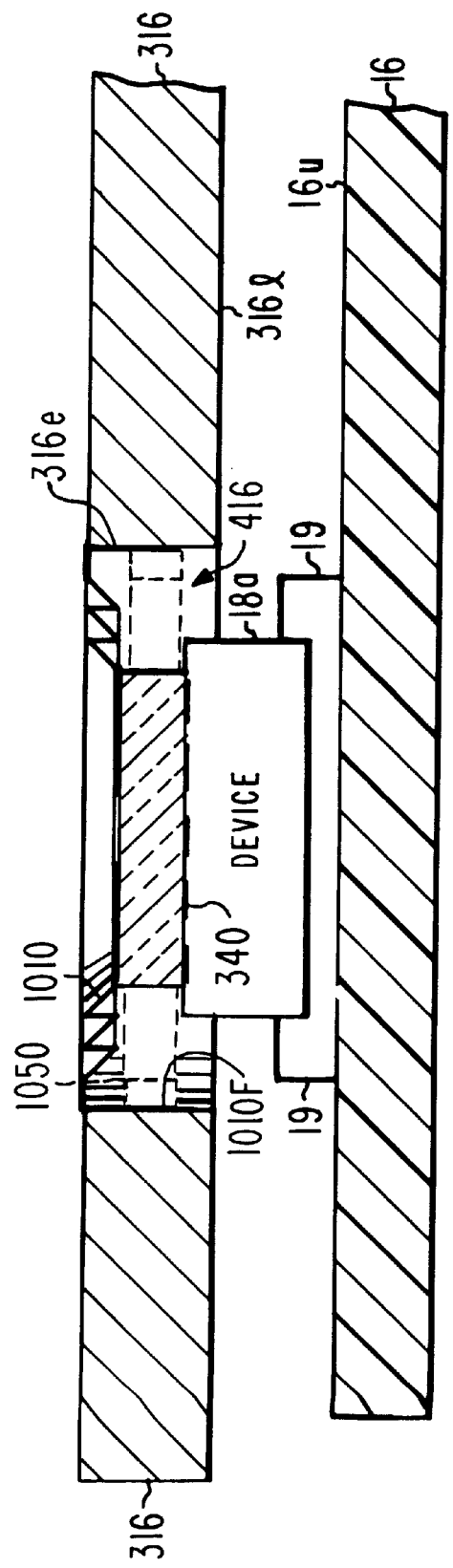
FIG. 10b is similar, but with a somewhat different mounting arrangement for the bellows.
Figure 10C:
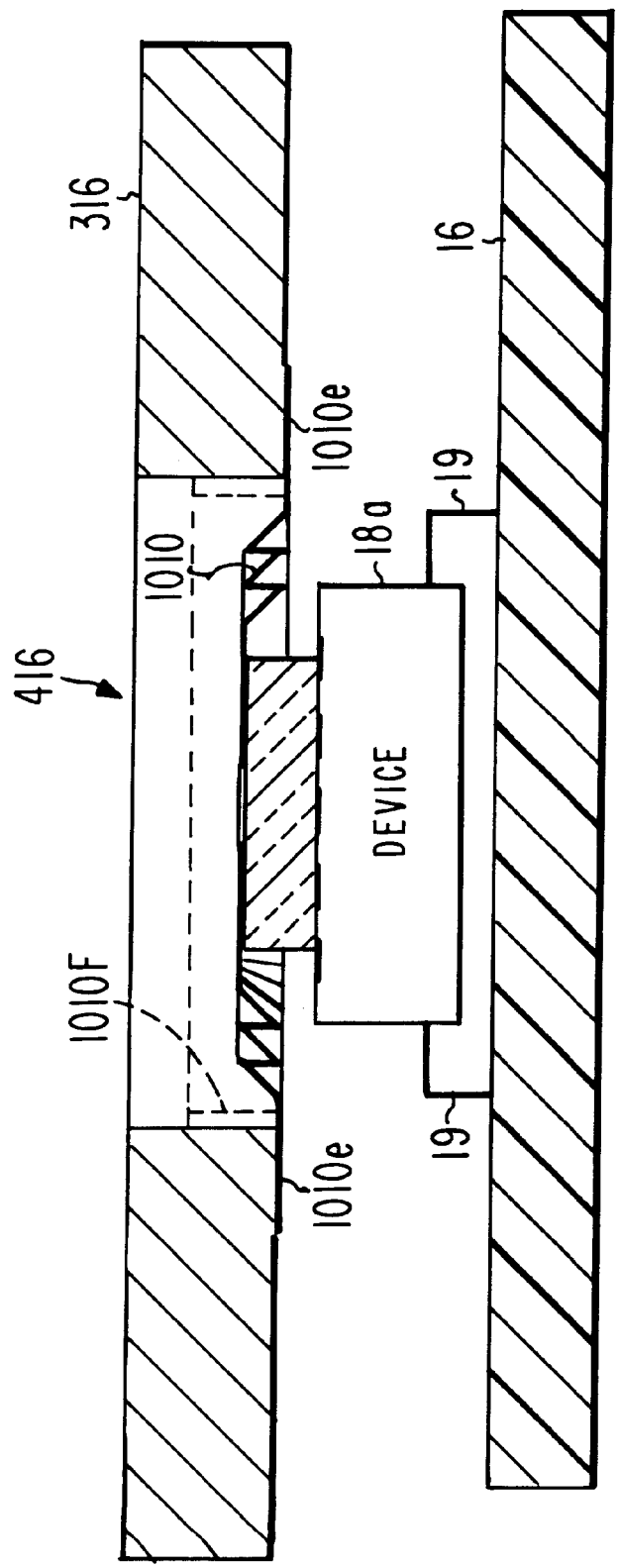
FIG. 10c is similar, but with the bellows mounted near the bottom of the aperture.

FIG. 10a is a simplified cross-sectional illustration of an arrangement according to an aspect of the invention, in which a heat conducting bellows is mounted near the top of the aperture for making contact with the component, and allows axial movement of the bellows toward and away from the component, FIG. 10b is similar, but with a somewhat different mounting arrangement for the bellows, and FIG. 10c is similar, but with the bellows mounted near the bottom of the aperture. In FIG. 10a, elements corresponding to those of FIG. 4 are designated by like reference numerals. As illustrated in FIG. 10a, aperture 416 has a thermally conductive bellows 1010, seen in cross-section, attached near its periphery to the peripheral edge 316e of aperture 416. Good thermal conductivity together with resilience are obtained when the bellows is of a metallic material. In order to aid in securely fastening the bellows in place, and to provide good thermal properties at the juncture between the periphery of the bellows and the edge 316e of the aperture 416, a washer or plate 1035 is placed over the region adjacent to the aperture 416, and is pressed against the heat transfer plate 316 by screws, such as 1030, with the peripheral portion of bellows 1010 sandwiched between. Also in FIG. 10a, the center of the bellows is connected to the upper surface of component 18a by a heat transfer device 318. The breakable junction for purposes of disassembly is designated by dash line 340.

In FIG. 10b, bellows 1010 has a peripheral flange 1010F which is dimensioned to lie against the inner edges 316e of aperture 416. The flange 1010F may have sufficient inherent spring to produce force tending to hold the flange against the edges of the aperture, or the flange may be bonded, as by adhesives or fusion bonding, or a clamp ring, illustrated in phantom as 1050, may be force-fitted over the flange, as for example by supercooling the clamp ring to thereby shrink the ring, placing the ring within the flange 1010F, and allowing it to return to room temperature, thereby creating an interference or force fit. The embodiments of FIGS. 10a and 10b allow the heat transfer plate 316 to be placed closer to the upper surface 16u of printed circuit board 16 than would be possible if the component were not allowed to project partially into aperture 416. Thus, the arrangement of FIGS. 10a and 10b are particularly suitable for the situation in which a mezzanine board such as 20 of FIG. 1 must be placed over the heat transfer plate 316 in a volume 14 with little height.

The embodiment of FIG. 10c has the bellows adjacent the lower portion of aperture 416, but is otherwise conceptually similar to the arrangement of FIG. 10a. An alternative holding arrangement involving flanges 1010F, illustrated in phantom, is conceptually similar to that of FIG. 10b. The bellows arrangements of FIGS. 10a, 10b, and 10c provide for the possibility of movement of the bellows to accommodate any variation in the vertical distance between the lower surface 316l of heat transfer plate 316 and the upper surface of component 18a.

Other embodiments of the invention will be apparent to those skilled in the art. More particularly, the metallization tabs of FIG. 7 can extend onto the upper surface (the surface facing the viewer), to make them readily accessible to a torch or soldering iron. The circularly cylindrical aperture and heatsink adapter of FIGS. 4, or 5 and 6, can also be metallized entirely, or with tabs, to allow fusion bonding. The cross-sectional shape of the aperture 416 in the heat transfer plate 316, and of the draw-tube, heatsink adapter, and/or bellows with which it is associated, can be round, square, rectangular, polygonal, or of an irregular shape, as may be desired. While the breakable junction 340 has in some cases been indicated as being at the bottom of heat transfer device 318, it could be at the top, or, if the heat transfer device is a layer of grease, there is no perceptible difference between the upper and lower surfaces.

Thus, an electronic assembly (10) according to an aspect of the invention includes a thermally conductive frame (12) defining an open, generally flat interior volume (14), with a planar printed wiring board (16) located within the interior volume (14). The printed wiring board (16) defines first (16u) and second surfaces (16l), and is loaded with components (18a, 18b) adjacent at least the first surface (16u). At least one of the components (18a, 18b) requires conductive heat sinking. Of course, in any one electronic assembly (10) more than one component may be heat sunk according to the invention, and there is no requirement that the same method be used for all of the components. The electronic assembly (10) also includes a heat transfer plate (316) mechanically and thermally coupled to the frame (12). The heat transfer plate (316) extends generally parallel with the plane of the printed wiring board (16), and is spaced away from the first surface (16u) of the printed wiring board (16) in a manner which leaves a gap (414) between that surface (316l) of the heat transfer plate (316) which is nearest the printed wiring board (16) and that one of the components (18a, 18b) requiring conductive heat sinking. The heat transfer plate (316) defines an aperture (416) registered with the one of the components (18a, 18b). A heatsink adapter (410; 410, 810) is thermally coupled to the edges (316ue, 316le; 416e) of the aperture (416), and is mechanically mounted at least partially within the aperture (416) in a manner which provides for motion in a direction (412) toward and away from the first surface (16u) of the printed wiring board (16) if a permanent bond is not provided. The heatsink adapter (410; 410, 810) is positioned at least partially within the aperture (416) in a manner selected for making thermal contact with the one of the components (18a, 18b), as a result of which a conductive heat path (320, 420, 322, 324, 226) extends from one of the components (18a, 18b), through the heatsink adapter (410; 410, 810), through the edges (316ue, 316le; 416e) of the aperture (416) into the heat transfer plate (316), and through the heat transfer plate (316) to the frame (12).

In a particular avatar of the invention (FIGS. 4 & 5; FIG. 6), the aperture (416) is circular, and the heatsink adapter (410; 410, 810) is a thermally conductive plug in the form of a right circular cylinder having a diameter (D) no greater than the diameter of the circular aperture (416). The heatsink adapter (410; 410, 810) is slideably mounted within the aperture (416), so long as not bonded by fusion or adhesive. Naturally, if it is so bonded, it becomes immovable within the aperture. A version (FIG. 6) of this avatar has an internally threaded (416it) circular aperture (416), and the heatsink adapter (410; 410, 810) is externally threaded (512) to match the threads (416it) of the circular aperture (416), whereby the heatsink adapter (410; 410, 810) can be moved by relative rotation, which slides the threads over each other for providing the desired motion toward and away from the printed circuit board (16). In another avatar (FIG. 7), the heatsink adapter (410; 410, 810) includes fusion bonding pads (710a, 710b, 710c, 710d, 710e, 710f) located on at least two sides of the heatsink adapter (410R), for facilitating fusion bonding to either the edges (316ue, 316le; 416e) of the aperture (416), the one of the components (18a, 18b), or both.

In a particular manifestation (FIG. 7) of the invention, the aperture (416) in the heat transfer plate (316) is rectangular, and the heatsink adapter (410R) is a thermally conductive rectangular plug with a set of dimensions no larger than the dimensions of the aperture (416), so that the plug is slideably movable within the aperture (416), in the absence of a permanent bond, to provide the motion toward and away from the printed-circuit board (16). In a version of this manifestation, fusion bonding pads (710a, 710b, 710c, 710d, 710e, 710f) are located on at least two sides of the heatsink adapter (410; 410, 810), for facilitating fusion bonding to the edges (316ue, 316le; 416e) of the aperture (416), to the one of the components (18a, 18b), or both.

Another embodiment of the invention is one (FIGS. 8 & 9) in which the heatsink adapter (410; 410, 810) includes a draw-tube arrangement (808). The drawtube arrangement (808) has at least two separate parts (410, 810), which may of course be permanently bonded together and to the adjacent edge(s) (316ue, 316le; 416e) of the aperture (416) and or the one of the components (18a, 18b) requiring heat sinking. A version (FIG. 9) of this embodiment is one in which at least one of the tubes (810) of the drawtube arrangement (808) is spring-loaded (by slot 810s) to provide pressure tending to hold heat-transfer surfaces in intimate contact. The draw-tube(s) (810) may of course have circular, rectangular or other cross-sections.

In yet a further hypostasis of the invention (FIGS. 10 & 11), the heatsink adapter (410; 410, 810) includes a bellows (1010). At least peripheral portions (1010e; 1010F) of the bellows are at least thermally coupled to the edges (316ue, 316le; 416e) of the aperture (416), and a central portion of the bellows is thermally coupled to the one of the components (18a, 18b). As in the other embodiments, one of the peripheral and central portions of the bellows, or both, may be permanently mechanically coupled to the edges (316ue, 316le; 416e) of the aperture (416) and the one of the components (18a, 18b), respectively.

What is claimed is:

1. An electronic assembly, comprising:

a thermally conductive frame defining an open, generally flat interior volume;

a planar printed wiring board located within said interior volume, said printed wiring board defining first and second surfaces, said printed wiring board being loaded with components adjacent at least said first surface, at least one of said components requiring conductive heat sinking:

a heat transfer plate mechanically and thermally coupled to said frame, said heat transfer plate extending generally parallel with the plane of said printed wiring board, and spaced away from said first surface of said printed wiring board in a manner which leaves a gap between that surface of said heat transfer plate which is nearest said printed wiring board and that one of said components requiring conductive heat sinking, said heat transfer plate defining an aperture registered with said one of said components; and a heatsink adapter thermally coupled to the edges of said aperture, and mechanically mounted at least partially within said aperture, for motion in a direction toward and away from said first surface of said printed wiring board, said heatsink adapter being positioned within said aperture in a manner selected for making thermal contact with said one of said components, whereby a conductive heat path extends from said one of said components, through said heatsink adapter, through the edges of said aperture into said heat transfer plate, and through said heat transfer plate to said frame.

2. An assembly according to claim 1, wherein:

said aperture is circular; and said heatsink adapter is a thermally conductive, plug in the form of a right circular cylinder having a diameter no greater than the diameter of said circular aperture.

3. An assembly according to claim 2, wherein:

said circular aperture is internally threaded; and said heatsink adapter is externally threaded to match the threads of said circular aperture, whereby said heatsink adapter can be moved by relative rotation.

4. An assembly according to claim 1, wherein said aperture is rectangular; and said heatsink adapter is a thermally conductive rectangular plug with a set of dimensions no larger than the dimensions of said aperture, so that said plug is slideably movable within said aperture.

5. An assembly according to claim 4, further comprising:

fusion bonding pads located on at least two sides of said heatsink adapter, for facilitating fusion bonding to said edges of said aperture and to said one of said components.

6. An assembly according to claim 1, wherein said heatsink adapter comprises:

a drawtube arrangement.

7. An assembly according to claim 6, wherein at least one tube of said drawtube arrangement is spring-loaded to provide pressure tending to hold heat-transfer surfaces in intimate contact.

8. An assembly according to claim 1, wherein said heatsink adapter comprises a bellows, the peripheral portions of which are at least thermally coupled to said edges of said aperture, and a central portion of which is thermally coupled to said one of said components.

9. An assembly according to claim 8, wherein one of said peripheral and central portions of said bellows is permanently mechanically coupled to said edges of said aperture and said one of said components, respectively.

* * * * *